United States Patent
Yang

(10) Patent No.: US 10,192,824 B2
(45) Date of Patent: Jan. 29, 2019

(54) EDGE STRUCTURE FOR MULTIPLE LAYERS OF DEVICES, AND METHOD FOR FABRICATING THE SAME

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/483,646

(22) Filed: Apr. 10, 2017

(65) Prior Publication Data

US 2018/0294224 A1  Oct. 11, 2018

(51) Int. Cl.
| | |
|---|---|
| H01L 23/528 | (2006.01) |
| H01L 27/105 | (2006.01) |
| H01L 23/532 | (2006.01) |
| H01L 21/311 | (2006.01) |
| H01L 21/768 | (2006.01) |
| H01L 21/02 | (2006.01) |

(52) U.S. Cl.
CPC ...... *H01L 23/5283* (2013.01); *H01L 21/0217* (2013.01); *H01L 21/02164* (2013.01); *H01L 21/31144* (2013.01); *H01L 21/76895* (2013.01); *H01L 23/53295* (2013.01); *H01L 27/1052* (2013.01)

(58) Field of Classification Search
CPC ........... H01L 23/5283; H01L 21/02164; H01L 21/0217; H01L 21/76895; H01L 23/53295; H01L 27/1052; H01L 21/31144
See application file for complete search history.

(56) References Cited

U.S. PATENT DOCUMENTS

| | | | |
|---|---|---|---|
| 9,165,823 B2 | 10/2015 | Chen | |
| 2012/0068259 A1* | 3/2012 | Park | H01L 27/0207 |
| | | | 257/329 |
| 2012/0306089 A1 | 12/2012 | Freeman et al. | |

(Continued)

FOREIGN PATENT DOCUMENTS

| | | |
|---|---|---|
| CN | 103563070 | 2/2014 |
| CN | 103871994 | 6/2014 |
| TW | 201605015 | 2/2016 |

OTHER PUBLICATIONS

"Office Action of Taiwan Counterpart Application," dated Aug. 22, 2018, pp. 1-9.

*Primary Examiner* — David Vu
(74) *Attorney, Agent, or Firm* — J.C. Patents

(57) ABSTRACT

An edge structure for multiple layers of devices including stacked multiple unit layers includes first and second stair structures. The first stair structure is at a first direction of the devices where device contacts are formed, including first edge portions of the unit layers at the first direction, of which the borders gradually retreat with increase of level height. The elevation angle from the border of the first edge portion of the bottom unit layer to that of the top one is a first angle. The second stair structure includes second edge portions of the unit layers at a second direction. The variation of border position of the second edge portion with increase of level height is irregular. The elevation angle from the border of the second edge portion of the bottom unit layer to that of the top one is a second angle larger than the first angle.

8 Claims, 4 Drawing Sheets

(56) References Cited

U.S. PATENT DOCUMENTS

| | | |
|---|---|---|
| 2014/0159127 A1 | 6/2014 | Lee et al. |
| 2015/0129878 A1* | 5/2015 | Shin .................. H01L 27/11578 |
| | | 257/66 |
| 2016/0027730 A1 | 1/2016 | Lee |
| 2016/0268278 A1 | 9/2016 | Kono et al. |

* cited by examiner

EDGE STRUCTURE FOR MULTIPLE LAYERS OF DEVICES, AND METHOD FOR FABRICATING THE SAME

BACKGROUND OF THE INVENTION

Field of Invention

This invention relates to a structure applicable to integrated circuits and fabrication thereof, and particularly relates to an edge structure for multiple layers of devices, and a method for fabricating the same.

Description of Related Art

In a structure of multiple layers of devices, such a three-dimensional (3D) device array such as a 3D memory array, the conductive lines for the respective levels of devices require electrical connection, so the conductive layers of the respective levels have to be exposed in a contact area for later electrical connection. As a result, a staircase contact pad structure is formed.

In a conventional method, such a stair structure is formed around the area of multiple layers of devices by forming a series of mask layers that gradually decrease in size and performing a plurality of one-layer etching steps and a plurality of mask trimming steps alternately between the respective formation steps of the mask layers. FIG. 1 illustrates, in an example using six photomasks, the sizes and the positions of the six mask layers 10-1 to 10-6 with respect to the area 100 of multiple layers of devices. As shown in FIG. 1, from the 1$^{st}$ mask layer 10-1 to the 6$^{th}$ mask layer 10-6, the mask layer dimension gradually becomes smaller with the same step difference in both of X direction and Y direction, so the width W$_Y$ of the Y-directional stair area is equal to the width W$_X$ of the X-directional stair area.

However, since the contact plugs and the patterns of Metal 1 are formed over the area of the X-directional (or Y-directional) staircase only, most of the area of the Y-directional (or X-directional) stair is wasted.

SUMMARY OF THE INVENTION

In view of the foregoing, this invention provides an edge structure for multiple layers of devices, of which the stair area at the direction where contacts are not formed can be much reduced to significantly reduce waste of the chip area.

This invention also provides a method for fabricating an edge structure for multiple layers of devices, which can be applied to fabricate the edge structure for multiple layers of devices of this invention.

The edge structure for multiple layers of devices of this invention includes a first stair structure and a second stair structure, wherein the multiple layers of devices comprises a plurality of unit layers being stacked. The first stair structure is at a first direction of the multiple layers of devices where contacts for the devices are to be formed, and includes first edge portions of the unit layers at the first direction, wherein the borders of the first edge portions gradually retreat with increase of the level height thereof, and the elevation angle from the border of the first edge portion of the bottom unit layer to the border of the first edge portion of the top unit layer is a first angle ($\theta_1$). The second stair structure includes second edge portions of the unit layers at a second direction, wherein the variation of border position of the second edge portion with increase of the level height is irregular, and the elevation angle from the border of the second edge portion of the bottom unit layer to the border of the second edge portion of the top unit layer is a second angle ($\theta_2$) that is larger than the first angle $\theta_1$.

In an embodiment, $\theta_1$ is in the range of 6° to 12°, and $\theta_2$ is in the range of 20° to 60°.

In an embodiment, each unit layer includes a first and a second material layers, and the first material layers and the second material layers of the unit layers are stacked alternately. It is possible that the first material layers comprise silicon nitride and the second material layers comprise silicon oxide.

The method for fabricating an edge structure for multiple layers of devices of this invention includes: forming a stack comprising a plurality of unit layers, a plurality of mask formation steps each of which forms a mask layer over the stack, and performing a plurality of etching steps and at least one mask trimming step alternately after each mask layer is formed, wherein each etching step removes exposed one unit layer. At a first direction of the multiple layers of devices where contacts of the devices are to be formed, the border of a mask layer not having been trimmed is more retreated than the border of a preceding mask layer having been subjected to the last mask trimming step thereof, while at a second direction of the multiple layers of devices, the border of the mask layer not having been trimmed at least exceeds the border of the preceding mask layer having been subject to the last mask trimming step thereof, and the distance (W$_2$) between the border of the firstly formed mask layer and the multiple layers of devices is smaller than the distance (W$_1$) between the border of the firstly formed mask layer and the multiple layers of devices at the first direction.

In an embodiment, at the second direction of the multiple layers of devices, the border of the mask layer not having been trimmed is predetermined to align with the border of the preceding mask layer not having been trimmed.

In an embodiment, each unit layer includes a first and a second material layers, and the first material layers and the second material layers of the unit layers are stacked alternately. It is possible that the first material layers comprise silicon nitride and the second material layers comprise silicon oxide.

In the edge structure for multiple layers of devices of this invention, since the elevation angle of the second stair structure at the second direction is larger than that of the first stair structure at the first direction where contacts are to be formed, the width of the stair area of the second direction is smaller so that waste of the chip area can be reduced.

In order to make the aforementioned and other objects, features and advantages of this invention comprehensible, a preferred embodiment accompanied with figures is described in detail below.

BRIEF DESCRIPTION OF THE DRAWINGS

FIGS. 4A and 4B illustrate, in a cross-sectional view, Y-directional stair structures each in an edge structure for multiple layers of devices according to two embodiments of this invention, wherein FIG. 4A shows a case where the Y-directional borders of all mask layers are fully aligned to each other and the same number of etching steps or mask trimming steps are performed after each mask layer is formed.

DESCRIPTION OF EMBODIMENTS

This invention is further explained with the following embodiments, which are just exemplary but are not intended to limit the scope of this invention.

Figure 1:
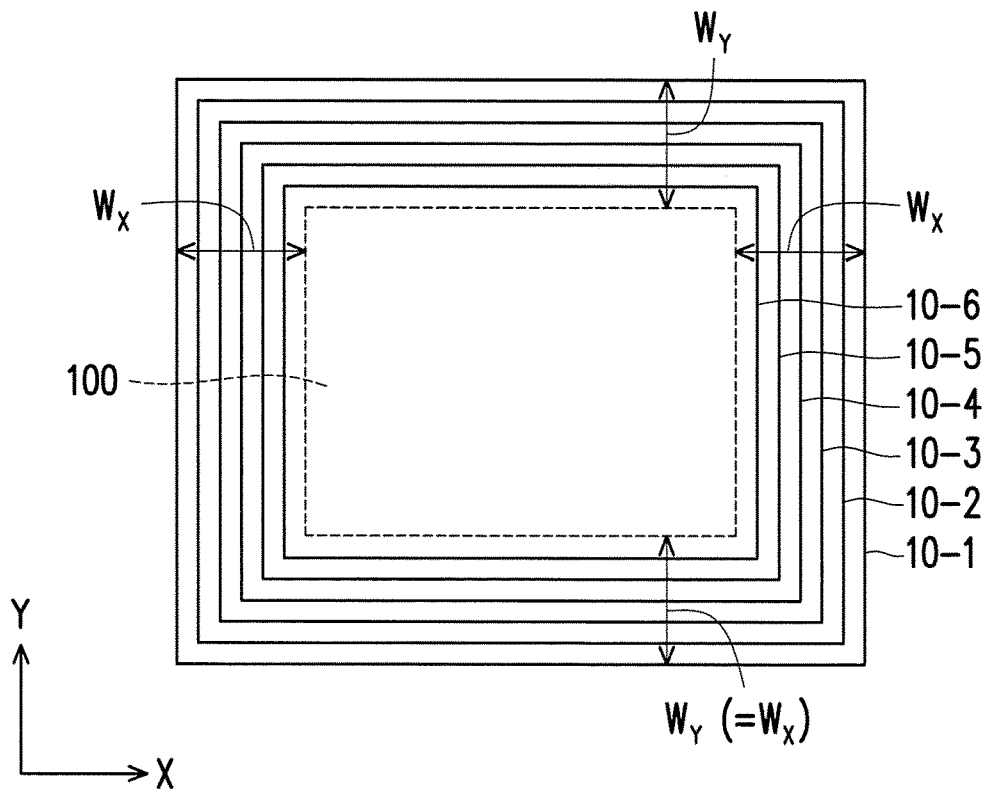
FIG. 1 illustrates, in a top view, a conventional mask design for fabricating an edge structure for multiple layers of devices in the prior art.
Figure 2:
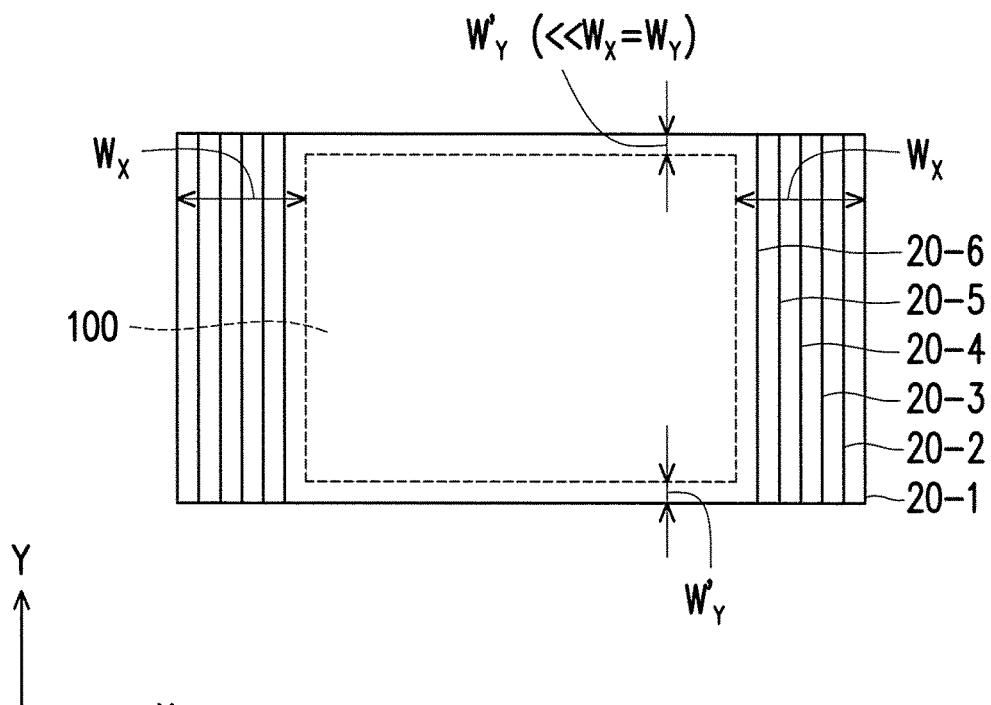
FIG. 2 illustrates, in a top view, a mask design for fabricating an edge structure for multiple layers of devices according to an embodiment of this invention.

FIG. 2 illustrates a mask design for fabricating an edge structure for multiple layers of devices according to an embodiment of this invention. The multiple layers of devices may comprise a 3D memory array.

Referring to FIG. 2, in this embodiment, six mask layers 20-1, 20-2, 20-3, 20-4, 20-5 and 20-6 are formed in sequence at different time points, and the direction at which contacts for the multiple layers of devices are to be formed is X-direction. The firstly formed mask layer 20-1 defines the borders of both the X-directional stair structure and the Y-directional stair structure, wherein the distance between the X-directional border of the mask layer 20-1 and the area 100 of the multiple layers of devices is namely the width $W_X$ of the X-directional stair structure to be formed, and the distance between the Y-directional border of the mask layer 20-1 and the area 100 is namely the width $W'_Y$ of the Y-directional stair structure to be formed.

Moreover, as shown in FIG. 2, a later formed mask layer has a more retreated X-directional border such that a regular stair structure with a sufficient tread width can be formed for later connection of contacts, and the width of the regular stair structure is $W_X$ as in the prior art. However, the respective Y-directional borders of the mask layers 20-1, 20-2, 20-3, 20-4, 20-5 and 20-6 are all predetermined to be aligned with other, of which the distance from the area 100 of the multiple layers of devices may be predetermined to be close to the distance between the X-directional border of the last formed mask layer 20-6 and the area 100, which is much smaller than the distance $W_X$ between the X-directional border of the firstly formed mask layer 20-1 and the area 100. By this design, the width $W_Y$ of the Y-directional stair structure can be much smaller than the width $W_X$ of the X-directional stair structure.

Though six mask layers are formed in the above embodiment, this invention is not limited thereto. The number of the formed mask layers can be increased or decreased with increase or decrease of the number of the stairsteps intended to be created, can be increased or decreased with increase or decrease of the height of each stairstep, and can be increased or decreased with increase or decrease of the tread width of each stairstep. In addition, if the width $W'_Y$ of the Y-directional stair structure is not necessary to minimize, the Y-directional border of a later formed mask layer (such as 20-5) may not be predetermined to align with the Y-directional border of the preceding mask layer (such as 20-4) as formed, but may be set to simply exceed the Y-directional border of the preceding mask layer having been subjected to the last trimming step thereof. This will be explained in details later referring to drawings.

Figure 3:
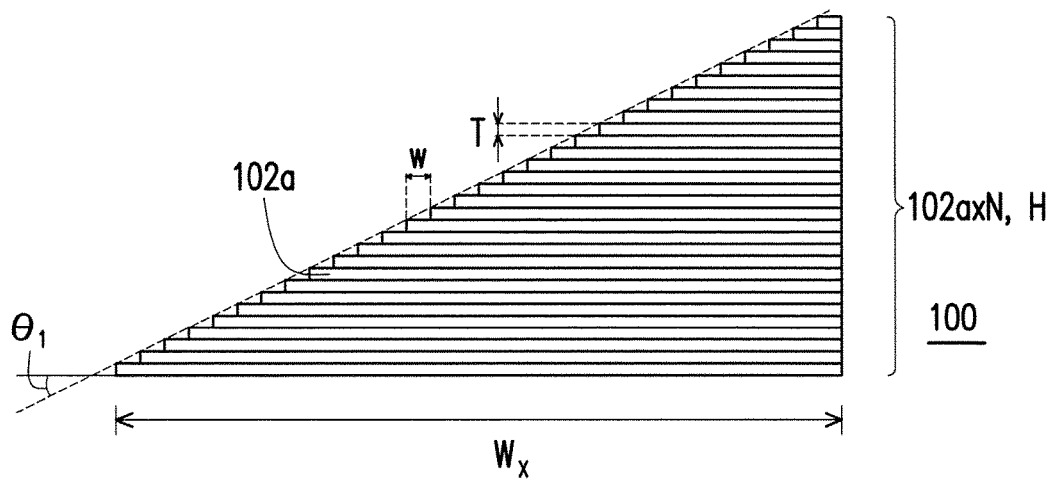
FIG. 3 illustrates, in a cross-sectional view, the X-directional stair structure in an edge structure for multiple layers of devices according to an embodiment of this invention, wherein the X direction is the direction of the multiple layers of devices where contacts of the devices are to be formed.

FIG. 3 illustrates, in a cross-sectional view, the X-directional stair structure in an edge structure for multiple layers of devices according to an embodiment of this invention. The X-directional stair structure can be the same as the conventional stair structure, including X-directional edge portions 102a of the unit layers, wherein the borders of the X-directional edge portions gradually retreat with increase of the level height thereof, and the elevation angle from the border of the X-directional edge portion 102a of the bottom unit layer to the border of the X-directional edge portion 102a of the top unit layer is $\theta_1$. The respective unit layers may have the same thickness (T), and the respective stairsteps may have the same tread width (w). The number N of the unit layers is usually 16 or more, such as 39, 60 or 96.

When the number of the unit layers or the number of the stairsteps to be formed is N, the number of the mask layers formed at different time points is M, and the number of the etching steps performed after the i-th (i=1 to M) mask layer is formed is $m_i$ ($m_i \geq 2$; the $m_i$ etching steps and $m_i-1$ mask trimming step(s) are performed alternately), the relationship $$"\sum_{i=1}^{M} m_i = N"$$

is present, wherein the $m_i$ etching steps performed after the i-th mask layer is formed defines $m_i$ stairsteps. Usually, the number of the etching steps performed after a mask layer is formed is less than or equal to the number of the etching steps performed after the preceding mask layer is formed, that is, the number $m_i$ of the etching steps performed after the i-th (i=2 to M) mask layer is formed is less than or equal to the number $m_{i-1}$ of the etching steps performed after the (i−1)-th mask layer is formed.

Figures 4A, 4B:
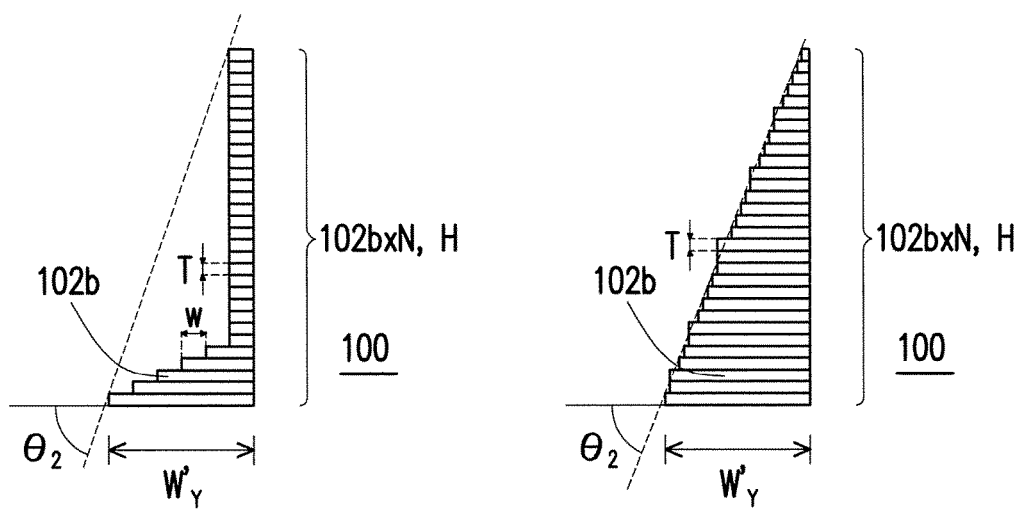

On the other hand, as shown in FIG. 4A/B, in embodiments where the Y-directional borders of all mask layers are predetermined to be aligned with each other, the width $W'_Y$ of the Y-directional stair structure over which no contacts are to be formed is much smaller than the width $W_Y$ (=$W_X$) of the conventional Y-directional stair structure. The Y-directional stair structure includes Y-directional edge portions 102b of the unit layers, wherein the variation of border position of the Y-directional edge portion 102b with increase of the level height is irregular, and the elevation angle from the border of the Y-directional edge portion 102b of the bottom unit layer to the border of the Y-directional edge portion 102b of the top unit layer is $\theta_2$, which is larger than the elevation angle $\theta_1$ of from the border of the X-directional edge portion 102a of the bottom unit layer to the border of the X-directional edge portion 102a of the top unit layer.

The width $W_X$ of the X-directional stair structure is the product of the total number N of the stairsteps to be formed and the tread with w of each stairsteps, i.e., $W_X$=N×w, wherein w value may be in the range of 300 nm to 800 nm. For example, when N=39 and w=500 nm, $W_X$ is 19.5 μm. On the other hand, in a case where the Y-directional borders of all the mask layers as formed are aligned to each other, the width $W'_Y$ of the Y-directional stair structure is the product of the number $m_{max}$ of the stairsteps defined by the mask layer which defines the largest number of stairsteps (usually the firstly formed mask layer) and the tread width w of each stairstep ($W'_Y$=$m_{max}$×w). For example, when $m_{max}$=8 and w=500 nm, $W'_Y$ is 4 μm.

When each of the mask layers defines the same number of stairsteps, the number of stairsteps defined by each mask layer is equal to (the total number N of the stairsteps to be formed)/(the number M of the mask layers formed) (i.e., $m_{max}=N/M$). In such case, the ratio of $W_X$ (=N×w) to $W'_Y$ (=$m_{max}$×w) is the number M of the mask layers formed. When the number of stairsteps defined by each mask layer is not a constant, $W_X/W'_Y \ne M$. In an embodiment, the ratio $W_X/W'_Y$ is in the range of 2 to 16.

In addition, the height H of the X-directional stair structure and the Y-directional stair structure is the product of the thickness T of each unit layer and the total number N of the stairsteps to be formed (H=T×N), wherein T may be in the range of 40 to 80 nm. Hence, $\theta_1$ is equal to $\tan^{-1}(H/W_X)=\tan^{-1}[(T\times N)/(N\times w)]=\tan^{-1}(T/w)$, $\theta_2$ is equal to $\tan^{-1}(H/W'_Y)$, and in the aforementioned case where the Y-directional borders of all the M mask layers as formed are aligned to each other and each mask layer defines the same number of stairsteps so that $W_X/W'_Y=M$, $\theta_2$ is equal to $\tan^{-1}(M\times T/w)$. In an embodiment, $\theta_1$ is in the range of 6° to 12°, and $\theta_2$ is in the range of 20° to 60°.

In a case where the Y-directional borders of all mask layers are fully aligned to each other, the same number of etching steps or mask trimming step(s) is/are performed after each mask layer is formed, and the width trimmed by each mask trimming step is completely the same, the area being etched in the etching steps performed after each mask layer is formed would be the same, and the resulting Y-directional stair structure would be as shown in FIG. 4A, wherein several stairsteps thereof from the bottom have the same tread width w as in the case of the X-directional stair structure, but the last stairstep directly reaches the upmost unit layer. In presence of factors such as alignment error, difference in the number of the etching steps or mask trimming step(s) performed after each mask layer is formed, and deviation of the trimmed width in each mask trimming step, an irregular Y-directional stair structure with narrower treads is obtained. An example of such structure is shown in FIG. 4B.

The above unit layer usually includes a first material layer and a second material layers. In such a case, the first material layers and the second material layers of the unit layers are stacked alternately.

In an embodiment, there is a sufficient etching selectivity between the first material and the second material so that a first material layer can serve as an etching stopper for the adjacent overlying second material layer and a second material layer can serve as an etching stopper for the adjacent overlying first material layer. It is possible that the first material comprises silicon nitride (SiN) and the second material comprises silicon oxide (SiO).

Formations of the above mask layers and the etching steps and the mask trimming steps performed after each of them are exemplified below with the formation of the first mask layer and the etching steps and the mask trimming steps performed after the first mask layer is formed. The description applies to both the X-directional edge area and the Y-directional edge area, which two differ in that the distance between the X-directional border of the first mask layer not having been trimmed and the area of the multiple layers of devices, namely $W_X$, is larger than the distance between the Y-directional border of the first mask layer not having been trimmed and the area of the multiple layers of devices, namely $W'_Y$, as in the case of the firstly formed mask layer 20-1 shown in FIG. 2.

Figure 5:
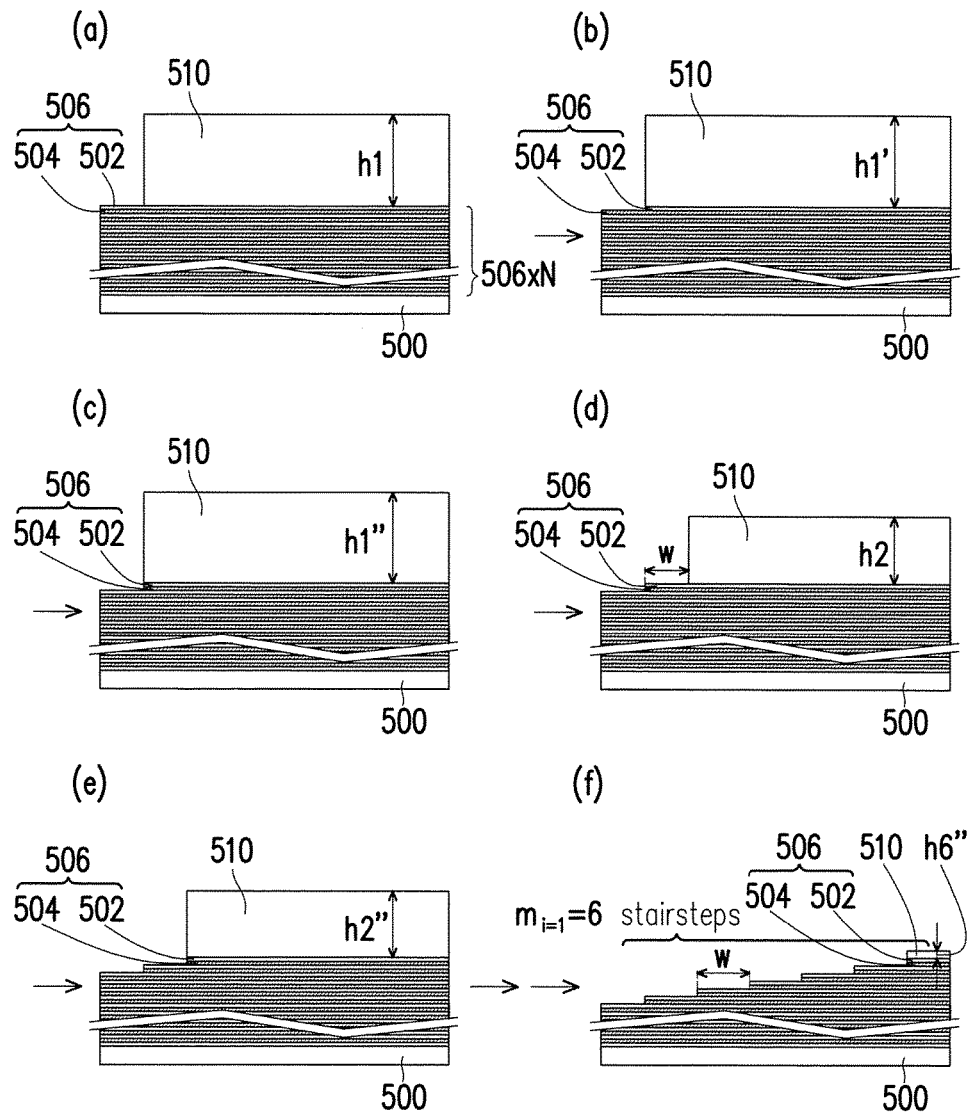
FIG. 5 illustrates, in a cross-sectional view, the etching steps and the mask trimming steps alternately performed after the first mask layer is formed, in a method for fabricating an edge structure for multiple layers of devices in an embodiment of this invention.

FIG. 5 illustrates, in a cross-sectional view, the etching steps and the mask trimming steps alternately performed after the first mask layer is formed, in a method for fabricating an edge structure for multiple layers of devices in an embodiment of this invention. Although each unit layer in this embodiment includes a silicon oxide layer and an SiN layer, this invention is not limited thereto. The two materials of each unit layer may alternatively be other combination wherein the two materials in the combination also have sufficient etching selectivity. In addition, although in this embodiment the first mask layer is used to define totally 6 stairsteps ($m_{i=1}=6$), this invention is not limited thereto.

Referring to FIG. 5, after N+1 silicon oxide layers each having an edge portion 502 and N silicon nitride layers each having an edge portion 504 are alternately stacked, a first photoresist layer 510 is formed over the stack (FIG. 5a). An SiN layer and the adjacent overlying silicon oxide layer are deemed a silicon oxide layer-SiN layer pair (abbreviated to "ON pair", each having an edge portion 506). The untrimmed first photoresist layer 510 exposes an end portion of the edge portion 502 of the upmost silicon oxide layer, and defines the borders of both the X-directional stair structure and the Y-directional stair structure. The thickness of each silicon oxide layer having an edge portion 502 may be in the range of 160 Å to 320 Å, for example. The thickness of each SiN layer having an edge portion 504 may be in the range of 240 Å to 480 Å, for example.

Then, the first photoresist layer 510 is used as a mask to etch the edge portion 502 of the upmost silicon oxide layer, with the edge portion 504 of the adjacent underlying SiN layer as an etching stopper (FIG. 5b), wherein the thickness h1' of the first photoresist layer 510 becomes smaller than the original thickness h1. Thereafter, the first photoresist layer 510 is used as a mask again to etch the edge portion 504 of the SiN layer that previously served as an etching stopper, with the edge portion 502 of the adjacent underlying silicon oxide layer as an etching stopper (FIG. 5c), so that the first stairstep is defined, wherein the thickness h1" of the first photoresist layer 510 becomes smaller than the previous thickness h1'. The above operation of etching the edge portion 502 of a silicon oxide layer and then etching the edge portion 504 of the adjacent underlying SiN layer is deemed one etching step.

A mask trimming step is then performed to trim a width w from the first photoresist layer 510, i.e., to retreat the border of the first photoresist layer 510 by a distance w, wherein the width w is namely the tread width of one stairstep. The mask trimming step also reduces the thickness of the first photoresist layer 510, making the thickness h2 thereof smaller than the previous thickness h1". Then, the first photoresist layer 510 having been subjected to the above mask trimming step is used as a mask to etch one layer of ON pair 506 (FIG. 5e), so as to define the second stairstep and simultaneously lower the level of the previously defined first stairstep by the height of one stairstep, wherein the thickness h2" of the first photoresist layer 510 becomes smaller than the previous thickness h2.

The combination of the above two etching steps and one mask trimming step defines totally two stairsteps. Then, four times (=$m_{i=1}$−2) of the above mask trimming step and four times of the above etching step are alternately performed to define four more stairsteps (FIG. 5f) and simultaneously lower the respective levels of the previously defined first and second stairsteps by the height of four stairsteps, thus completing definition of totally six (=$m_{i=1}$) stairsteps. After that, the thickness h6" of the first photoresist layer 510 becomes too small so that the first photoresist layer 510 cannot sustain one more mask trimming step and therefore cannot be used to define more stairsteps and has to be removed.

Figure 6:
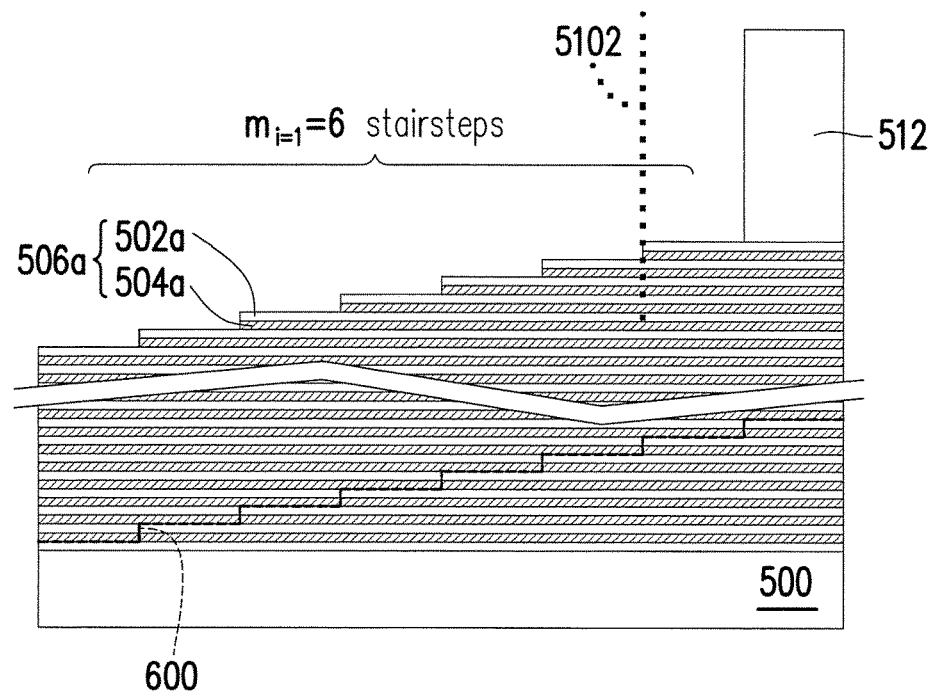
FIGS. 6 and 7 illustrates, in a cross-sectional view, the X/Y-directional stair area just after the second mask layer is formed in the above embodiment of this invention.
Figure 7:
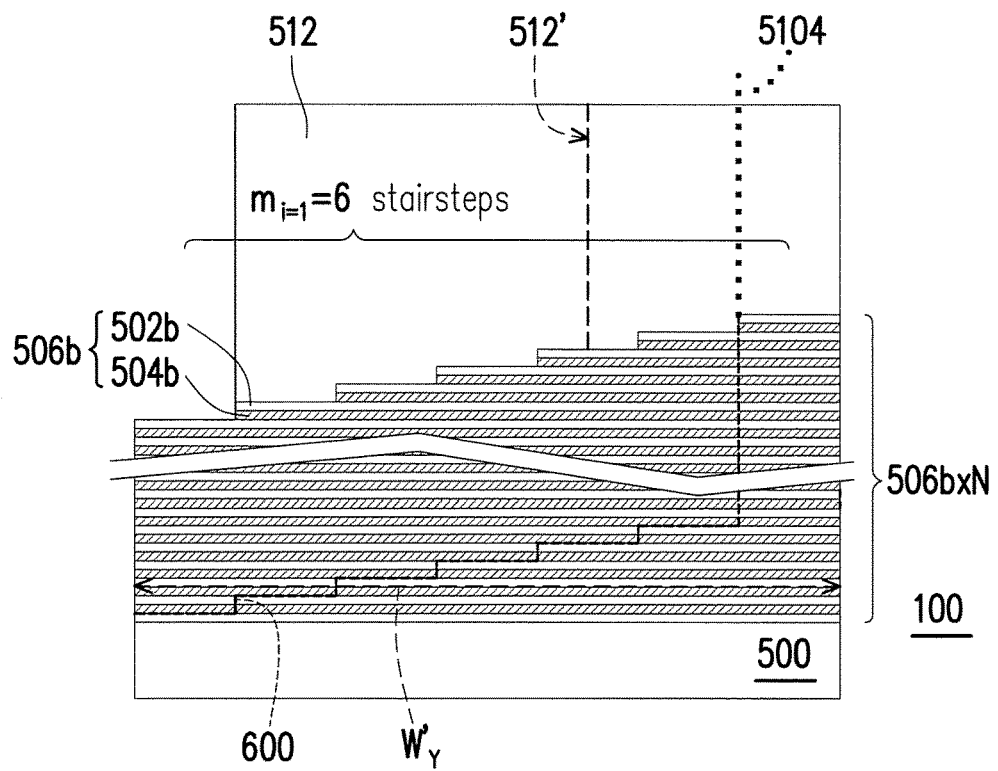

Referring to FIGS. 6 and 7, a second photoresist layer 512 is then formed, of which the profile in the X-directional edge area is shown in FIG. 6 and the profile in the Y-directional edge area is shown in FIG. 7. In the X-directional edge area, the X-directional edge portions 502a of the silicon oxide layers and the X-directional edge portions 504a of the SiN layers, which form X-directional edge portions 506a of the ON pairs, are to be defined. In the Y-directional edge area, the Y-directional edge portions 502b of the silicon oxide layers and the Y-directional edge portions 504b of the SiN layers, which form Y-directional edge portions 506b of the ON pairs, are to be defined.

As shown in FIG. 6, the X-directional border of the second photoresist layer 512 not having been trimmed is more retreated than the X-directional border (the position thereof is indicated by the dash line 5102) of the preceding first photoresist layer 510 having been subjected to the last trimming step thereof (FIG. 5f), so as to define next stairstep.

On the other hand, as shown in FIG. 7, the Y-directional border of the second photoresist layer 512 not having been trimmed can be predetermined to align with the Y-directional border of the preceding first photoresist layer 510 not having been trimmed (FIG. 5b). With such design, when the number ($m_{i=2}$) of the etching steps performed after the $2^{nd}$ photoresist layer 512 is formed is less than or equal to the number ($m_{i=1}$) of the etching steps performed after the $1^{st}$ photoresist layer 510, and the width trimmed in each mask trimming step is constant, in the Y-directional edge area, only the previously etched area shown in FIG. 5 will be etched in the etching steps performed after the $2^{nd}$ photoresist layer 512 is formed.

Nevertheless, if the width $W'_Y$ of the Y-directional stair structure to be formed is not necessary to minimize, the Y-directional border of the $2^{nd}$ photoresist layer not having been trimmed may be set to simply exceed the Y-directional border (the position thereof is indicated by the dash line 5104) of the preceding $1^{st}$ photoresist layer 510 having been subjected to the last trimming step thereof (FIG. 5f), as in the case of the $2^{nd}$ photoresist layer 512'.

After the $2^{nd}$ photoresist layer 512 or 512' is formed, $m_{i=2}$ times of the above etching step and $m_{i=2}-1$ time(s) of the above mask trimming step are performed alternately, and then M-2 photoresist layers are formed at different time points, and after the i-th photoresist layer is formed $m_i$ times of the above etching step and $m_i-1$ time(s) of the above mask trimming step are performed alternately. In the above process, as in the case of the $2^{nd}$ photoresist layer 512 or 512', the X-directional border of the i-th (i=3 to M) photoresist layer not having been trimmed is more retreated than that of the (i-1)-th photoresist layer having been subjected to the last mask trimming step thereof, and the Y-directional border of the i-th photoresist layer not having been trimmed at least exceeds that of the (i-1)-th photoresist layer having been subject to the last mask trimming step thereof. Thereby, an X-directional stair structure and a Y-directional stair structure are completed. Since the X-directional border of the i-th (i=2 to M) photoresist layer not having been trimmed is more retreated than that of the (i-1)-th photoresist layer having been subjected to the last mask trimming step thereof but the Y-directional border of the i-th photoresist layer not having been trimmed at least exceeds that of the (i-1)-th photoresist layer having been subject to the last mask trimming step thereof, the etched part at the Y direction must be smaller than the etched part at the X direction, so the width $W'_Y$ of the Y-directional stair structure must be less than the width $W_X$ of the X-directional stair structure.

The profile of an end portion of the X-directional stair structure is indicated by the dash line 600 in FIG. 6. The profile of the Y-directional stair structure in the case where the Y-directional borders of all the photoresist layers as formed are aligned with each other can be schematically indicated by the dash line 600 in FIG. 7. Specifically, what are indicated by the dash line 600 and the width $W'_Y$ in FIG. 7 are respectively the profile and the width of the Y-directional stair structure obtained in the case where the Y-directional borders of all the photoresist layers as formed are fully aligned with each other, the number of the etching steps or mask trimming step(s) performed after each photoresist layer is performed is constant, and the trimmed width of photoresist layer in each trimming step is constant, while the position of the area 100 of the multiple layers of devices is also shown in the figure. If there is a deviation or difference in any of the above aspects, the resulting Y-directional stair structure will further have other kind of irregularity.

An example of the method of the above embodiment is shown in the table below, wherein the total number of the ON pairs is 39 and totally 39 stairsteps are defined.

| No. of photoresist layer | 1 | 2 | 3 | 4 | 5 | 6 |
|---|---|---|---|---|---|---|
| Number of defined stairsteps | 8 | 7 | 6 | 6 | 6 | 6 |
| Number of mask trimming steps | 7 | 6 | 5 | 5 | 5 | 5 |
| Total number of stairsteps | 8 | 15 | 21 | 27 | 33 | 39 |

After the above stair structures including alternately stacked silicon oxide layers and SiN layers are formed, the SiN in the stair structures can be replaced by a conductive material, such as polysilicon or tungsten, using a known method to fabricate stair structures including alternately stacked silicon oxide layers and conductive layers for later connection with the contacts for the multiple layers of devices.

In the edge structure for multiple layers of devices of this invention, since the elevation angle of the second stair structure at the second direction is larger than that of the first stair structure at the first direction where contacts are to be formed, the width of the stair area of the second direction is smaller so that waste of the chip area can be reduced. In addition, when the border of the mask layer not having been trimmed is predetermined to align with that of the preceding mask layer not having been trimmed at the second direction of the area, the stair area of the second direction can be minimized.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:
1. An edge structure for multiple layers of devices, wherein the multiple layers of devices comprises a plurality of unit layers being stacked, comprising:
   a first stair structure at a first direction of the multiple layers of devices where contacts for the devices are to be formed, including first edge portions of the unit layers at the first direction, wherein borders of the first edge portions gradually retreat with increase of a level height thereof, and an elevation angle from the border of the first edge portion of the bottom unit layer to the border of the first edge portion of the top unit layer is a first angle ($\theta_1$); and a second stair structure, including second edge portions of the unit layers at a second direction, wherein variation of border position of the second edge portion with increase of the level height is irregular, and an elevation angle from the border of the second edge portion of the bottom unit layer to the border of the second edge portion of the top unit layer is a second angle ($\theta_2$) that is larger than the first angle $\theta_1$, wherein a number of the unit layers is 16 or more, the first direction is orthogonal with the second direction, and the second stair structure has a first part and a second part above the first part, wherein in the first part, variation of border position of the second edge portion with increase of the level height is regular, in the second part, borders of the second edge portions of a corresponding part of the unit layers are aligned with each other, and a height of the second part is over a half of a total height of the second stair structure.

2. The edge structure of claim 1, wherein $\theta_1$ is in a range of 6° to 12°, and $\theta_2$ is in a range of 20° to 60°.

3. The edge structure of claim 1, wherein the first direction is X direction and the second direction is Y direction, or the first direction is Y direction and the second direction is X direction.

4. The edge structure of claim 1, wherein each unit layer comprises a first material layer and a second material layer, and the first material layers and the second material layers of the unit layers are stacked alternately.

5. The edge structure of claim 4, wherein the first material layers comprise silicon nitride, and the second material layers comprise silicon oxide.

6. The edge structure of claim 4, wherein the first material layers comprise a conductive material, and the second material layers comprise an insulating material.

7. The edge structure of claim 1, wherein a number of the unit layers is 39, 60 or 96.

8. The edge structure of claim 1, wherein the multiple layers of devices comprise a 3D memory array.

* * * * *